US00RE37865E

(19) United States
(12) Reissued Patent
Dennison

(10) Patent Number: US RE37,865 E
(45) Date of Reissued Patent: Oct. 1, 2002

(54) SEMICONDUCTOR ELECTRICAL INTERCONNECTION METHODS

(75) Inventor: Charles H. Dennison, San Jose, CA (US)

(73) Assignee: Micron Technology, Inc., Boise, ID (US)

This patent issued on a continued prosecution application filed under 37 CFR 1.53(d), and is subject to the twenty year patent term provisions of 35 U.S.C. 154(a)(2).

(21) Appl. No.: 08/528,062

(22) Filed: Sep. 14, 1995

Related U.S. Patent Documents

Reissue of:
(64) Patent No.: 5,244,837
Issued: Sep. 14, 1993
Appl. No.: 08/033,830
Filed: Mar. 19, 1993

(51) Int. Cl.[7] ..... H01L 21/4763; H01L 21/44
(52) U.S. Cl. ..... 438/622; 438/624; 438/633; 438/637
(58) Field of Search ..... 437/192, 194, 437/195, 228, 978; 257/758, 759, 760; 156/630, 653.1, 657.1, 644.1; 438/622, 623, 624, 629, 631, 633, 634, 637

(56) References Cited

U.S. PATENT DOCUMENTS 3,904,454 A * 9/1975 Magdo et al. ..... 438/702
4,617,193 A * 10/1986 Wu ..... 437/246
4,789,648 A * 12/1988 Chow et al. ..... 437/225
4,808,552 A * 2/1989 Anderson ..... 437/187
5,084,414 A * 1/1992 Manley et al. ..... 437/189
5,091,339 A * 2/1992 Carey ..... 216/18
5,110,712 A * 5/1992 Kessler et al. ..... 437/228
5,112,765 A * 5/1992 Cederbaum et al. ..... 437/41
5,354,711 A * 10/1994 Heitzmann et al. ..... 438/638
5,612,254 A * 3/1997 Mu et al. ..... 438/631

OTHER PUBLICATIONS

Kaanta, C., et al., "Dual Damascene: A ULSI Wiring Technology," Jun. 11–12, 1991, VMIC Conf. pp. 144–152.*
Wolf., S., Silicon Processing for the VLSI Era, vol. 2, 1990. Lattice Press, pp. 189–194, 214–217, 238–256, 257–260, 261–263, 276–287.*

* cited by examiner

*Primary Examiner*—T. N. Quach
(74) *Attorney, Agent, or Firm*—TraskBritt

(57) ABSTRACT

A semiconductor metallization processing method for multilevel electrical interconnection includes: a) providing a base insulating layer atop a semiconductor wafer; b) etching a groove pathway into the base layer; c) providing a first contact through the base layer to the area to which electrical connection is to be made; d) the groove pathway being etched and the first contact being provided in a combined manner which has the groove pathway and the first contact communicating with one another; e) providing metal within the first contact and within the groove pathway, the metal provided within the first contact and groove pathway in combination defining a first metal layer, the first metal layer having an overall thickness which is sufficient to fill the first contact and groove pathway; f) planarizing the first metal layer back to the uppermost region to form a conductive metal runner within the groove pathway; g) providing an overlying layer of insulating material which is different in composition from the base layer uppermost region; h) etching through the overlying layer selectively relative to the uppermost region to provide a second contact to the conductive metal runner which overlaps the conductive metal runner and uppermost region of insulating material of the base layer, the conductive metal runner being void of surround where the second contact overlaps the conductive metal runner; and i) depositing and patterning a second metal layer atop the etched overlying layer of insulating material.

43 Claims, 8 Drawing Sheets

SEMICONDUCTOR ELECTRICAL INTERCONNECTION METHODS

Matter enclosed in heavy brackets [ ] appears in the original patent but forms no part of this reissue specification; matter printed in italics indicates the additions made by reissue.

TECHNICAL FIELD

This invention relates generally to semiconductor metallization processing methods for imparting multi-level electrical interconnection.

BACKGROUND OF THE INVENTION

Multi-level metallization is a critical area of concern in advanced semiconductor fabrication where designers continue to strive for circuit density maximization. Metallization interconnect techniques typically require electrical connection between metal layers or runners occurring at different elevations within a semiconductor substrate. Such is typically conducted, in part, by etching a contact opening through insulating material to the lower elevation metal layer. Increased circuit density has resulted in narrower and deeper electrical contact openings between layers within the substrate. Adequate contact coverage within these deep and narrow contacts continues to challenge the designer.

Aluminum and aluminum alloys remain the principle metallization materials of choice due to their high conductivities. However, deep and narrow contact openings are very difficult to fill by conventional aluminum deposition techniques. Such techniques are principally limited to sputter deposition.

One way of overcoming this problem is to chemical vapor deposit (CVD) another more conformal metal, such as tungsten, which enables complete contact filling. CVD tungsten would typically completely fill a contact opening, where sputter deposition of aluminum would not. Techniques for CVD of aluminum have yet to be developed. Use of tungsten is not without drawbacks. For example, tungsten has three times the resistivity of aluminum, which can result in parts with lower speed or increased die size to provide for wider tungsten lines for obtaining desired current flow. In addition to resistivity problems, tungsten does not bond readily to other commonly used semiconductor metals, such as gold or aluminum.

One technique for making multi-level metal electrical interconnection in ULSI processing involves groove and fill techniques, such as is described in Kaanta, et al., "Dual damascene: A ULSI Wiring Technology", a paper submitted at the Jun. 11–12, 1991 VMIC Conference sponsored by the IEEE. Such reference describes a technique whereby a combination of contact openings is provided through an insulating layer to active areas, and a groove pathway is as well etched at the top of the insulating layer. Thereafter, a single layer of tungsten metal is deposited to completely fill the contact openings and pathway. A subsequent planarization is conducted to the upper level of the insulating layer to define isolated finished conductive lines or runners.

Improvements still need to be made to such techniques for further maximization of circuit density and to accommodate or allow use of sputtered aluminum for second or upper level metallization. One prior art drawback is described with reference to FIGS. 1–3. FIG. 1 illustrates a semiconductor wafer fragment 10 comprised of a bulk substrate 12 having a planarized insulating layer 14, such as $SiO_2$. Another planarized insulating layer 16 is provided atop layer 14, and provided with a pair of etched groove pathways 18, 20 (see also FIG. 3). A metal layer 22, preferably predominantly aluminum such as sputtered deposited aluminum, is provided atop layer 16 and completely fills within groove pathways 18, 20.

Referring to FIGS. 2 and 3, layer 22 is planarized by chemical-mechanical polishing techniques back to at least the upper surface of insulator layer 16 to define electrically isolated conductive first level metal runners 24 and 26. Another layer of insulating material 28 is provided atop the wafer. A masking and etch of layer 28 are then provided to produce contact openings 30, 32 for ultimately connecting a higher metal layer to runners 24 and 26. It is important to conduct such etching for a time sufficient to insure complete passage through material 28 to reach the upper surface of the runners 24 and 26. Accordingly, if the photomask alignment were not precise such that openings 30 and 32 were to overlap with portions of runners 24 and 26 and with layer 16, undesired over etch into layer 16 would occur.

To prevent or allow for such misalignment, enlarged surround areas 34, 36 are provided when etching layer 16 to form groove pathways 18, 20. It will be appreciated that such enlarged areas necessitate positioning conductive lines 18 and 20 farther apart than were such surround areas 34 and 36 not provided. Accordingly, providing such surround areas works against maximizing circuit density.

FIG. 4 illustrates the problem associated with overetch where a metal 2 to metal 1 contact opening is misaligned. There illustrated is a wafer fragment 10a having a misaligned metal 2 to metal 1 contact opening 30a, with there being no surround area to accommodate such eventual mask misalignment. The etch of layer 28 causes a recess or pocket 38 to form externally adjacent runner 26. Again, the desired material for second or higher level metallization is predominantly aluminum which is typically deposited by sputter deposition. FIG. 4 illustrates a sputter deposited aluminum layer 40 which, because of recess or pocket 38, does not adequately fill contact opening 30a. Such creates the illustrated discontinuity in layer 40.

FIG. 5 illustrates a technique for overcoming problems associated with the potential above-described metal 2 to metal 1 discontinuity. Here, a wafer fragment 10b having misaligned metal 2 to metal 1 contact opening 30a acquires a highly conformal chemical vapor deposited layer of tungsten 42. Such layer is planarized back to define a conductive plug or via 42 of tungsten. Thereafter, a layer 44 of aluminum can be provided and patterned as illustrated. While overcoming the discontinuity problem referred to above, the FIG. 5 technique adds the additional processing steps of adding a CVD tungsten deposition, requiring an associated "glue" layer, and subsequent etchback. These additional processing steps increase wafer processing cost and lowers yield by adding defects.

It would be preferable if all or the metal 2 layer were predominately comprised of aluminum. Further, it would be desirable to develop improved interlevel metallization interconnection schemes involving groove and fill, or damascene, processes of a first or lower level metal followed by the utilization of a sputtered aluminum for the upper level metal, and which do not fundamentally require formation of space-consuming surround of a via by the lower level metal.

BRIEF DESCRIPTION OF THE DRAWINGS

Preferred embodiments of the invention are described below with reference to the following accompanying drawings.

FIG. 14 is a view of the FIG. 10 wafer shown at a processing step subsequent to that shown by FIG. 13.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor metallization processing method for multi-level electrical interconnection comprises the following steps:

providing a base layer of insulating material atop a semiconductor wafer over an area to which electrical connection is to be made, the base layer of insulating material having an uppermost region;

etching a groove pathway into the base layer of insulating material for definition of a conductive metal runner;

providing a first contact through the base layer to the area to which electrical connection is to be made;

the groove pathway being etched and the first contact being provided in a combined manner which has the groove pathway and the first contact communicating with one another;

providing metal within the first contact and within the groove pathway, the metal provided within the first contact and groove pathway in combination defining a first metal layer, the first metal layer having an overall thickness which is sufficient to fill the first contact and groove pathway;

planarizing the first metal layer back to the uppermost region of the base insulating layer to form a conductive metal runner within the groove pathway;

providing an overlying layer of insulating material atop the base layer of insulating material and formed conductive metal runner, the insulating material of the overlying layer being different in composition from the insulating material of the uppermost region of the base layer with the insulating material of the overlying layer being selectively etchable relative to the insulating material of the uppermost region and selectively etchable relative to the first metal layer;

etching through the overlying layer of insulating material selectively relative to the uppermost region of insulating material of the base layer to provide a second contact to the conductive metal runner, the second contact overlapping the conductive metal runner and uppermost region of insulating material of the base layer, the conductive metal runner being void of surround where the second contact overlaps the conductive metal runner, the uppermost region of the insulating material of the base layer functioning as a contact etch stop during etching of the overlying layer and thereby substantially preventing etching of insulating material of the base layer adjacent the conductive metal runner; and depositing and patterning a second metal layer atop the etched overlying layer of insulating material, the second metal layer lining within the second contact and contacting the conductive metal runner therewithin.

Figure 6:
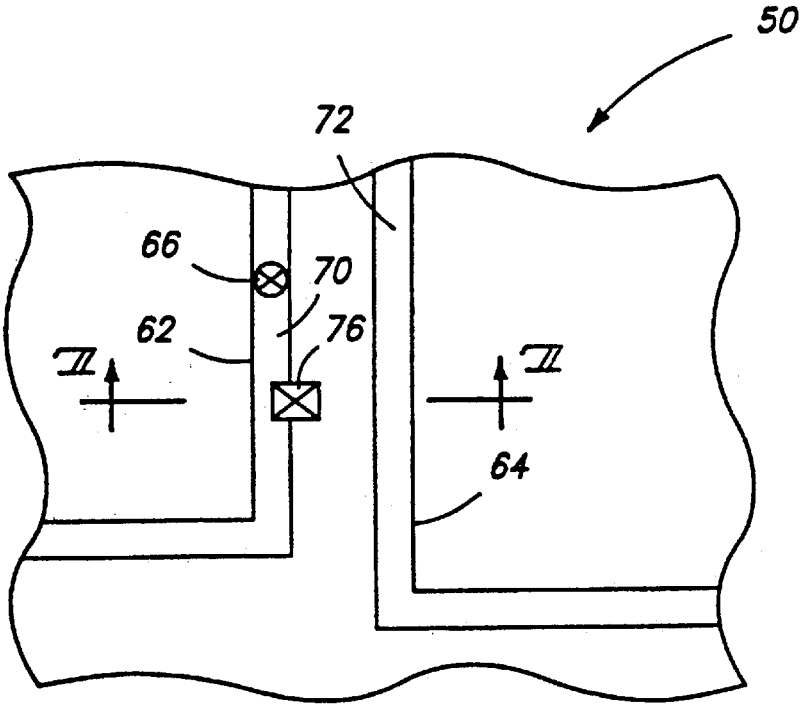
FIG. 6 is a diagrammatic top view of a semiconductor wafer fragment processed in accordance with the invention.
Figure 7:
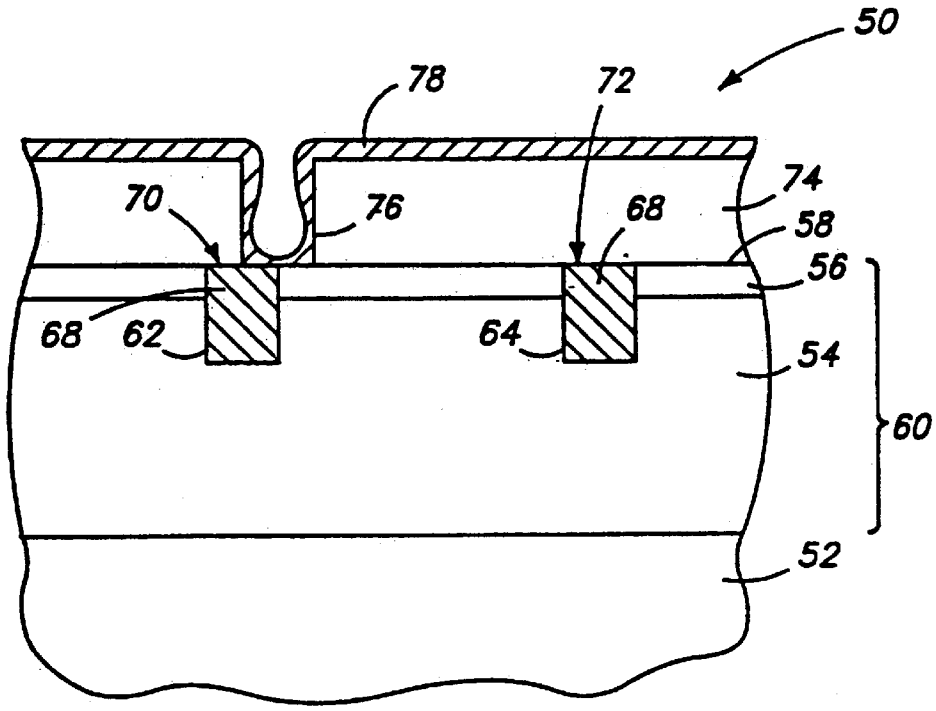
FIG. 7 is sectional view of the FIG. 6 wafer.

More particularly and first with reference to FIGS. 6 and 7, a wafer fragment 50 comprises a bulk substrate region 52 and a first layer 54 of insulating material provided over an area to which electrical connection is to be made. A principal purpose of layer 54 is for the formation of grooves to be filled with metal. An example material for layer 54 would be borophosphosilicate glass (BPSG), phosphosilicate glass (PSG), $SiO_2$ provided by plasma TEOS deposition, $SiO_2$ provided by ozone TEOS deposition, and other oxides or other insulators.

A second layer 56 of insulating material is provided atop first layer 54, with the insulating material of the second layer being different from the insulating material of the first layer. An example preferred material for the second layer would be an insulative nitride, such as $Si_3N_4$. The thickness of layer 56 is preferably from about 500 Angstroms to about 2000 Angstroms. Second layer 56 has an upper surface 58. Alternately considered, the composite insulating layers 54 and 56 can be considered as a base layer of insulating material 60 having an uppermost region defined by layer 56.

Groove pathways 62, 64 are etched into base layer 60 for definition of conductive metal runners, as will be apparent from the continuing discussion. Groove pathways 62, 64 are etched completely through uppermost region/second insulating layer 56 and partially into first insulating layer 54.

A first contact 66 (FIG. 6) is provided through base layer 60 to the area on the substrate to which electrical connection is to be made. First contact 66 and groove pathway 62 communicate with one another. In the illustrated embodiment, contact 66 falls entirely within the confines of groove pathway 62. Of course, either of contact 66 or groove pathway 62 could be formed before the other. Alternatively, contact 66 could be first defined and filled with metal prior to formation of grooves 62, 64, as will be discussed below.

A first metal layer 68 is deposited atop the wafer and to within groove pathways 62, 64 and the illustrated contact 66 to a thickness sufficient to fill first contact 66 and groove pathways 62, 64. In this manner for this embodiment, metal is thus provided within the first contact and within the groove pathway, with the metal provided within the first contact and groove pathway in combination defining a first metal layer, with the first metal layer having an overall thickness which is sufficient to fill the first contact and groove pathway. An example and preferred metal would be sputter deposited aluminum to provide a predominantly aluminum layer, although other metals such as tungsten could also be employed. Such layer is planarized back at least to uppermost region 56 to form electrically isolated conductive metal runners 70, 72. The preferred technique for such planarizing is a chemical-mechanical polishing technique. Less preferred would be a plasma etchback process.

A third or overlying layer 74 of insulating material is provided atop base layer 60 and formed conductive metal runners 70, 72. The insulating material of third or overlying insulating layer 74 is different in composition from the insulating material of the second layer/uppermost region 56, with the insulating material of the third or overlying layer being selectively etchable relative to the insulating material of uppermost region 56 and selectively etchable relative to the metal of runner 70. Where uppermost region/second layer 56 comprises $Si_3N_4$, layer 74 could be an oxide, such as the same material described for first insulating layer 54. Under such conditions, a dry plasma etch employing for example $CHF_3$ and $O_2$ would enable selective etching of layer 74 relative to uppermost region 56 and most all metals, including tungsten and aluminum. Other materials could of course be selected for uppermost region 56 and layer 74. For example, uppermost region 56 might comprise an oxide, while region 74 might comprise polyimide.

Figure 1:
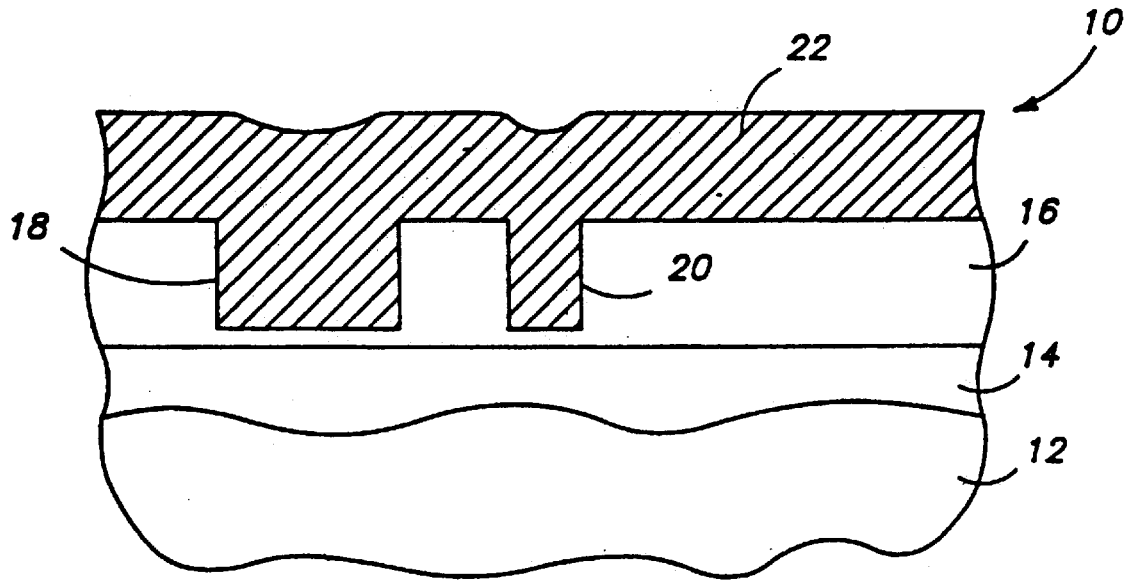
Fig 1 PRIOR ART
FIG. 1 is a diagrammatic view of a semiconductor wafer fragment processed in accordance with prior art techniques, and is discussed in the "Background" section above.
Figure 2:
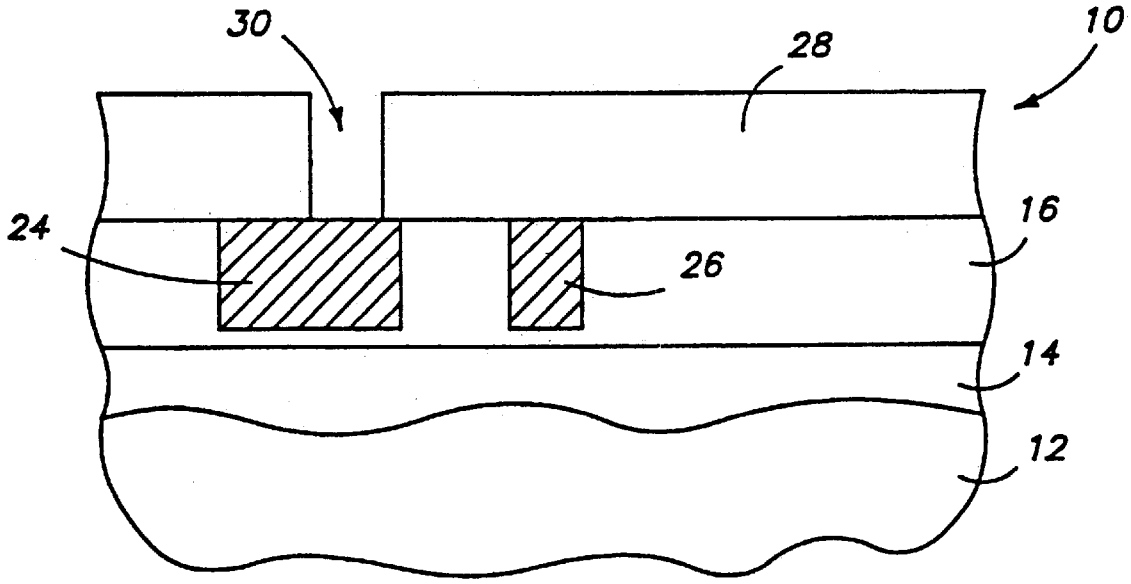
Fig 2 PRIOR ART
FIG. 2 is a sectional view of the FIG. 1 wafer fragment at a prior art processing step subsequent to that shown by FIG. 1.
Figure 3:
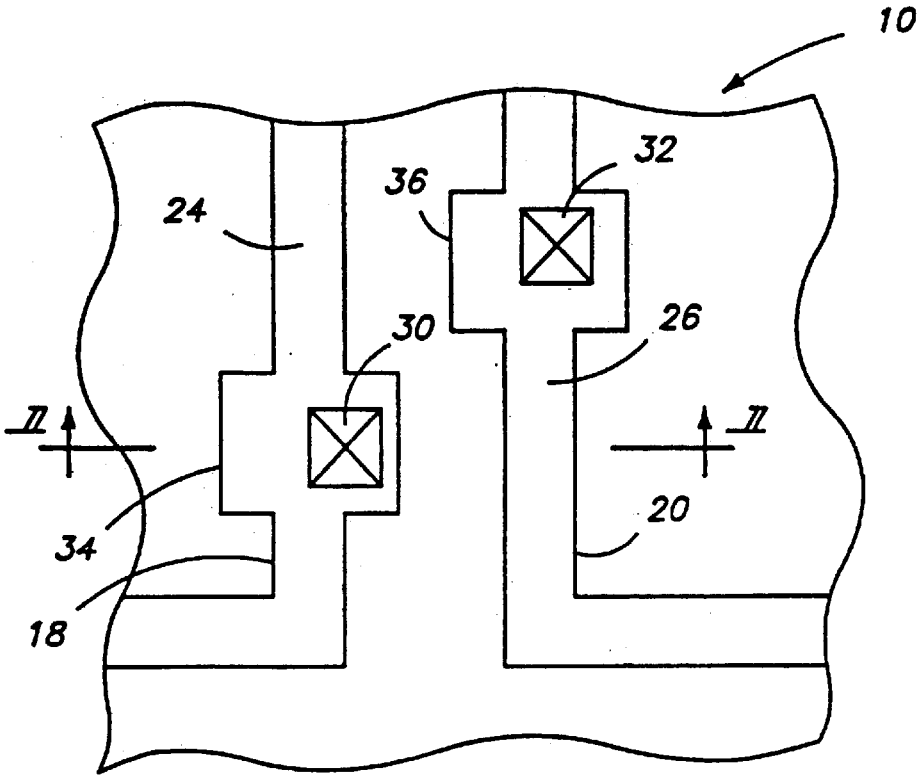
FIG 3 PRIOR ART
FIG. 3 is a top plan view of the FIG. 2 semiconductor wafer fragment.
Figure 4:
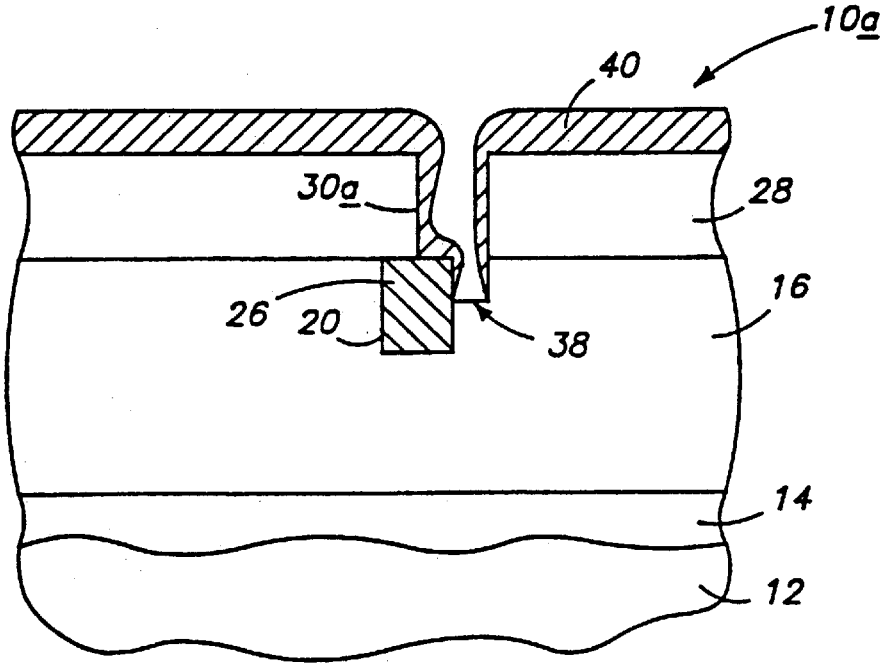
FIG 4 PRIOR ART
FIG. 4 is a diagrammatic view of an alternate semiconductor wafer fragment process in accordance with prior art techniques, and is discussed in the "Background" section above.
Figure 5:
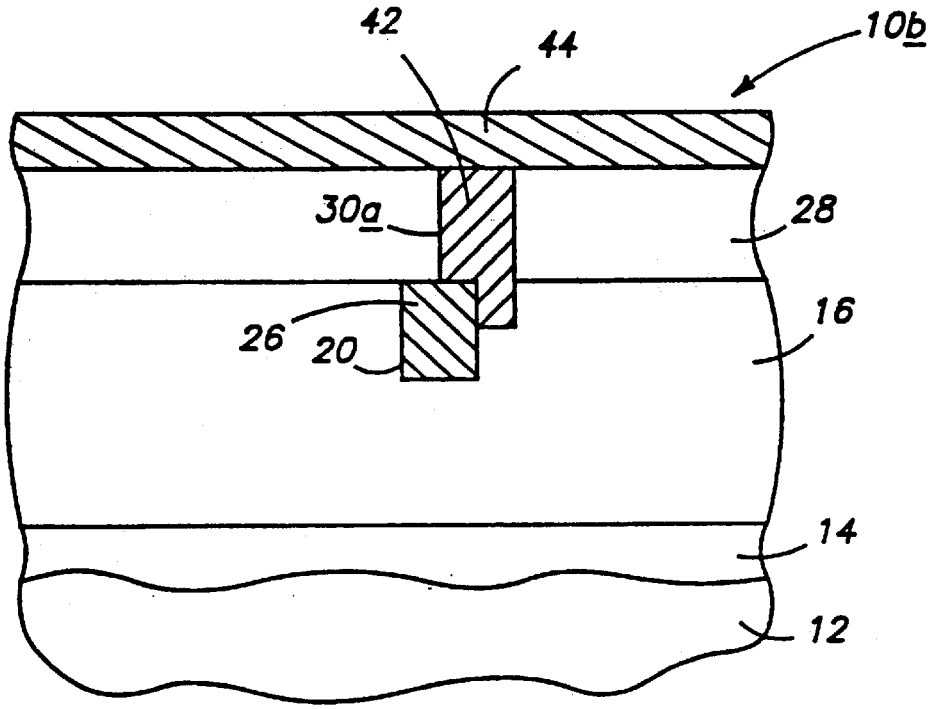
FIG 5 PRIOR ART
FIG. 5 is a diagrammatic view of another semiconductor wafer fragment processed in accordance with prior art techniques, and is discussed in the "Background" section above.

Overlying or third layer of insulating material 74 is patterned and selectively etched relative to layer/region 56 to provide a second contact 76 to conductive metal runner 70. Second contact 76 will at some locations overlap conductive metal runner 70 and uppermost region/second layer 56 due to inevitable mask misalignment. During such etch, uppermost region/second layer 56 functions as a contact etch stop and thereby substantially prevents etching of insulating material of layers 56 and 54 adjacent conductive metal runner 70. Such avoids formation of a recess, as described with respect to the prior art of FIGS. 4 and 5. Such also enables conductive metal runner 70 to be formed void of surround where second contact 76 overlaps conductive metal runner 70, unlike the prior art described with reference to FIGS. 1–3.

A second metal layer 78 is deposited atop etched third/overlying layer 74, and lines within second contact 76 and contacts conductive metal runner 70 therewithin. The preferred metal and deposition technique is sputtered aluminum or one of its alloys. Application of such layer might completely fill second contact 76 or only partially fill contact 76, as shown. Such layer would be patterned to define second, higher elevation, metal runners.

Figure 8:
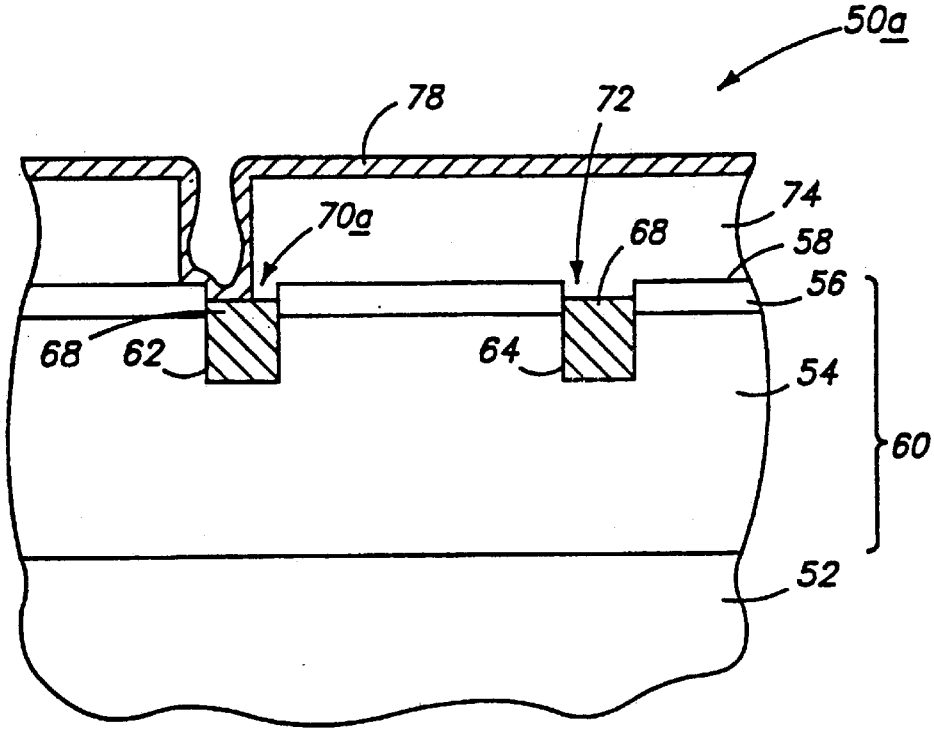
FIG. 8 is a diagrammatic view of an alternate semiconductor wafer fragment processed in accordance with the invention.

FIG. 8 illustrates a wafer 50a evidencing an additional processing step in accordance with the invention. Specifically, metal layer 68 prior to deposition of overlying layer 74 is selectively etched within groove pathway 62 relative to base insulating layer/uppermost region 56 to form a slightly recessed conductive metal runner 70a within the base layer of insulating material. Such provides an added benefit of assuring no pocket or recess etching adjacent the metal runner in the event slight overetch of second layer/uppermost region 56 were to occur during the contact 76 etch. An etchant would be selected by the artisan which would etch metal 68 selectively relative to region 56. An example would be $CCl_4$ and $Cl_2$ or $BCl_3$ chemistry. Alternately, a CMP slurry could be selected for the polish of material 68 which has a significant chemical effect on material 68. An example CMP slurry where metal 68 is comprised predominately of aluminum and region 56 is predominately comprised of nitride would be KOH based.

As will be apparent, the embodiments described with reference to FIGS. 6–8 have a base layer of insulating material which is other than homogeneous. That is, base layer 60 is comprised of a composite of two layers 54 and 56 of different material. Alternately, base layer of insulating material 60 could be formed to be homogeneous, with the proviso that region 74 be of a material which is selectively etchable relative to the material of region 60 and selectively etchable relative to the first metal layer.

Figure 9:
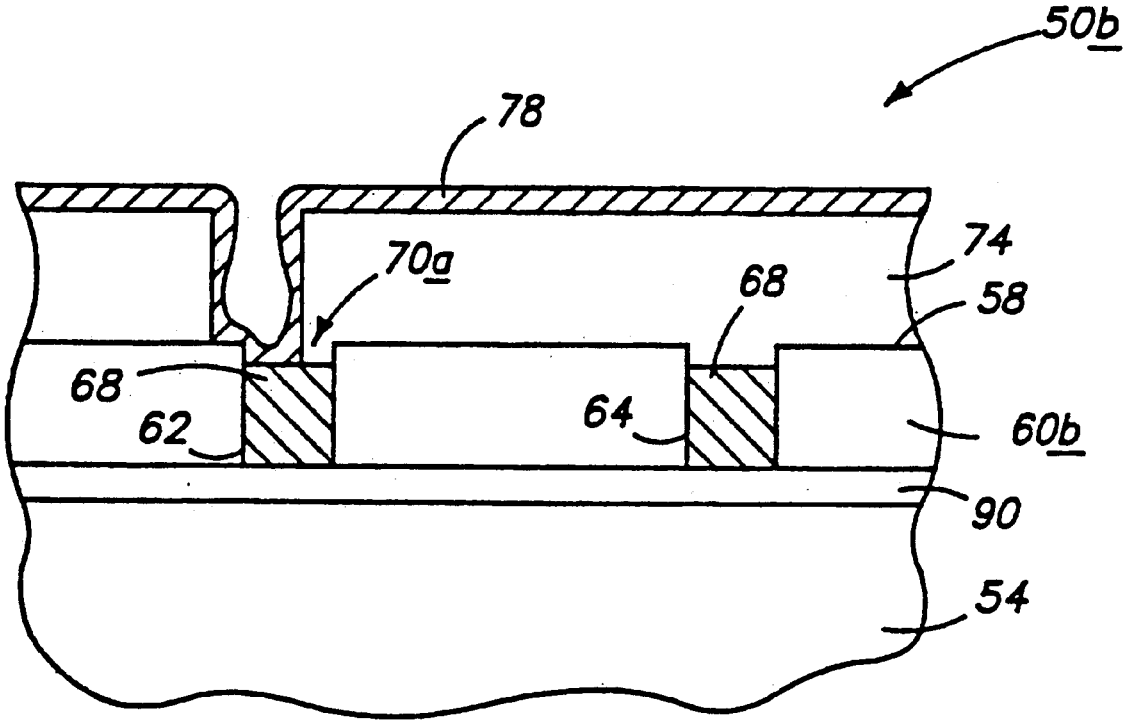
FIG. 9 is a diagrammatic sectional view of yet another semiconductor wafer fragment processed in accordance with the invention.

FIG. 9 illustrates this alternate aspect of the invention as well as another enhancement. Note that wafer 50b has a homogeneous base layer 60b. Additionally, a reference layer 90 has been deposited prior to deposition of homogeneous layer 60b. Reference layer 90 would be formed of some material different from the material of layer 60b. The etch to form groove pathways 62, 64 would then be conducted in such a manner to be selective to reference layer 90, thus providing a more accurately and precisely controlled etch stop for formation of groove pathway 62. Such would result in more controllability as to the preciseness of the uppermost elevation the metal runners 70 and 72 to be formed.

An alternative embodiment of the invention is described with respect to FIGS. 10–14. FIGS. 10–13 are sectional views taken through an alternate wafer fragment 50c and would correspond in position to a line parallel to line 7—7 in FIG. 6 as drawn through contact 66. Such contact in the ensuing figures and description is designated 66a. FIG. 14 is a cross sectional view of the 50c wafer as would be taken through a line positionally the same as line 7—7 in FIG. 6.

Figure 10:
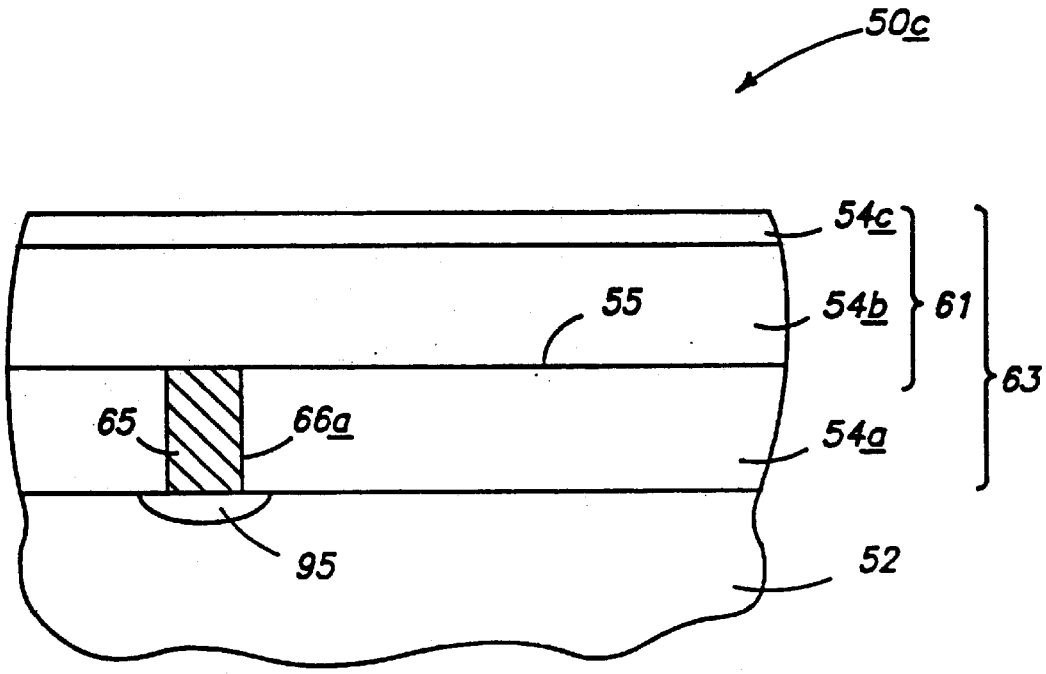
FIG. 10 is a diagrammatic sectional view of still a further semiconductor wafer fragment processed in accordance with the invention.

Referring first to FIG. 10, a wafer fragment 50c is provided with a primary layer 54a of insulating material over an area 95 to which electrical connection is to be made. Primary layer 54a includes an upper surface 55. A first contact 66a is provided through primary layer 54a to area 95. A layer of plugging metal 65 was deposited atop the wafer over primary layer 54a and to within first contact 66a to a thickness sufficient to fill first contact 66a. Such plugging metal was planarized back to upper surface 55 of primary insulating layer 54a to form a conductive layer plug 65 within first contact 66a.

A secondary layer 54b of insulating material is provided atop primary layer 54a and conductive metal plug 65. Subsequently, a tertiary layer of insulating material 54c is provided atop secondary layer 54b. Alternately considered, layers 54c and 54b in combination can be considered as a foundation layer 61 of insulating material, with layer 54c constituting an uppermost region thereof. Further alternately considered, layers 54b and 54c in combination can be considered as a base insulating layer, with layer 54c constituting an uppermost region thereof. Even further alternately considered, layers 54a, 54b and 54c in combination can be considered as a base layer 63 of insulating material, with layer 54c constituting an uppermost region thereof.

Figure 11:
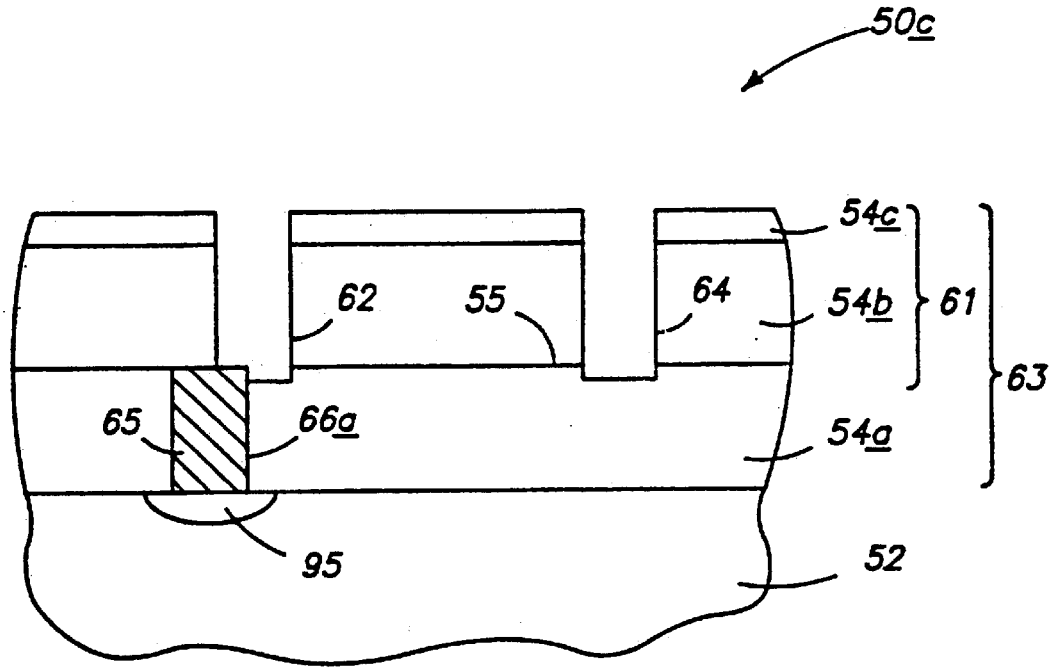
FIG. 11 is a view of the FIG. 10 wafer shown at a processing step subsequent to that shown by FIG. 10.

Referring to FIG. 11, groove pathways 62, 64 are etched into foundation layer 61 for definition of a conductive metal runner. Groove pathway 62 outwardly exposes conductive metal plug 65 as indicated. It would be the intent to align groove 62b entirely over plug 65. Offset is shown, and corresponding undesired over-etch into layer 54a. Layer 54a and 54b would preferably be provided of different insulating materials with different etch characteristics, such that layer 54b could be etched selectively relative to 54a and preferable desirably prevent the illustrated overetch. Examples would be two different oxides, for layers 54b and 54a, having different dopants or dopant concentrations to enable 54a to preferably function to a significant degree as an etch stop for the etch of grooves 62, 64.

Figure 12:
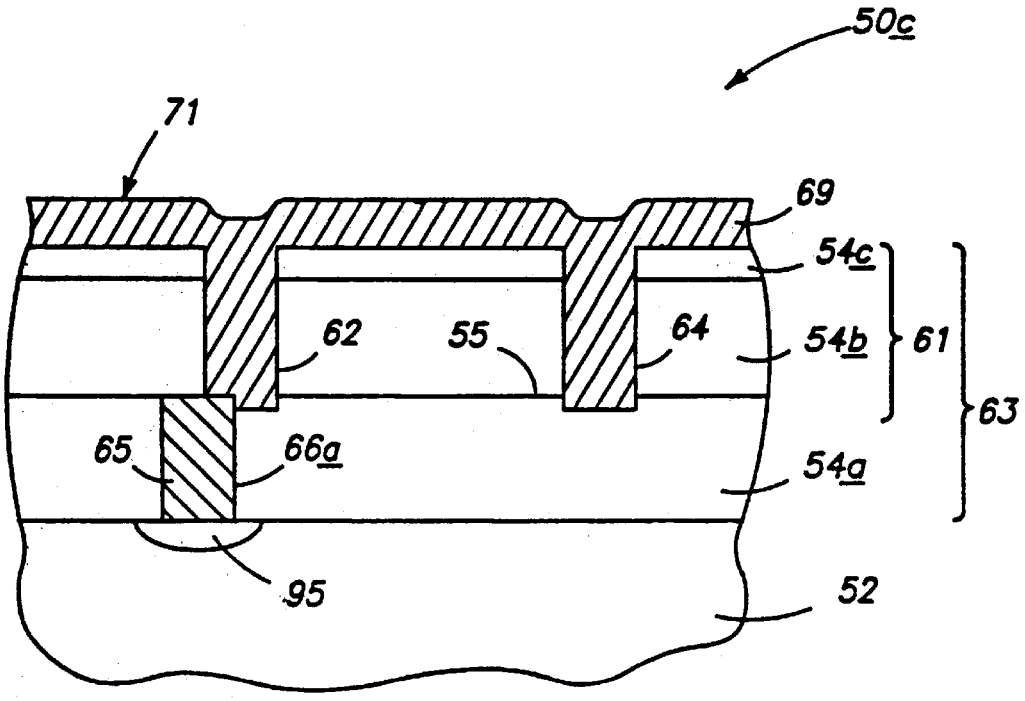
FIG. 12 is a view of the FIG. 10 wafer shown at a processing step subsequent to that shown by FIG. 11.

Referring to FIG. 12, a groove filling metal layer 69 is provided atop the wafer and within groove pathways 62, 64 and contacts and thereby electrically connects with conductive metal plug 65. Layer 69 could be sputtered aluminum, or some other metal, with chemical vapor deposited tungsten being preferred to assure adequate and complete filling of any over etch adjacent conductive plug 65 into primary layer 54a. The material of conductive plug 65 preferably is comprised predominately of aluminum, but could likewise comprise other metals such as chemical vapor deposited tungsten. Groove filling metal 69 and conductive metal plug 65 in combination define a first metal layer 71.

Figure 13:
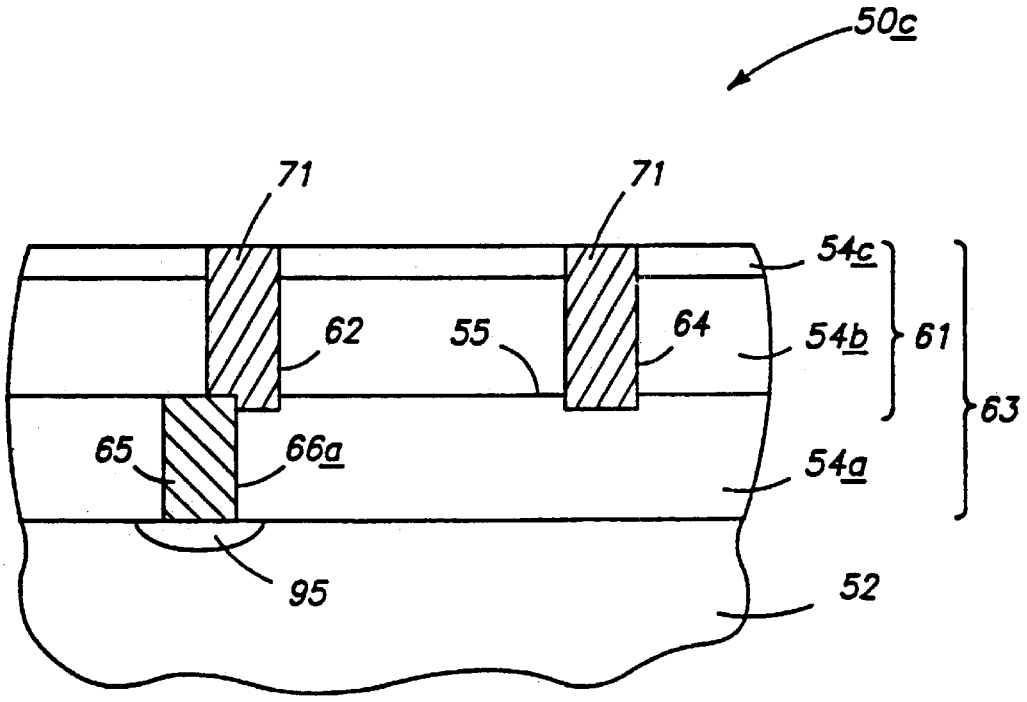
FIG. 13 is a view of the FIG. 10 wafer shown at a processing step subsequent to that shown by FIG. 12.
Figure 11A:
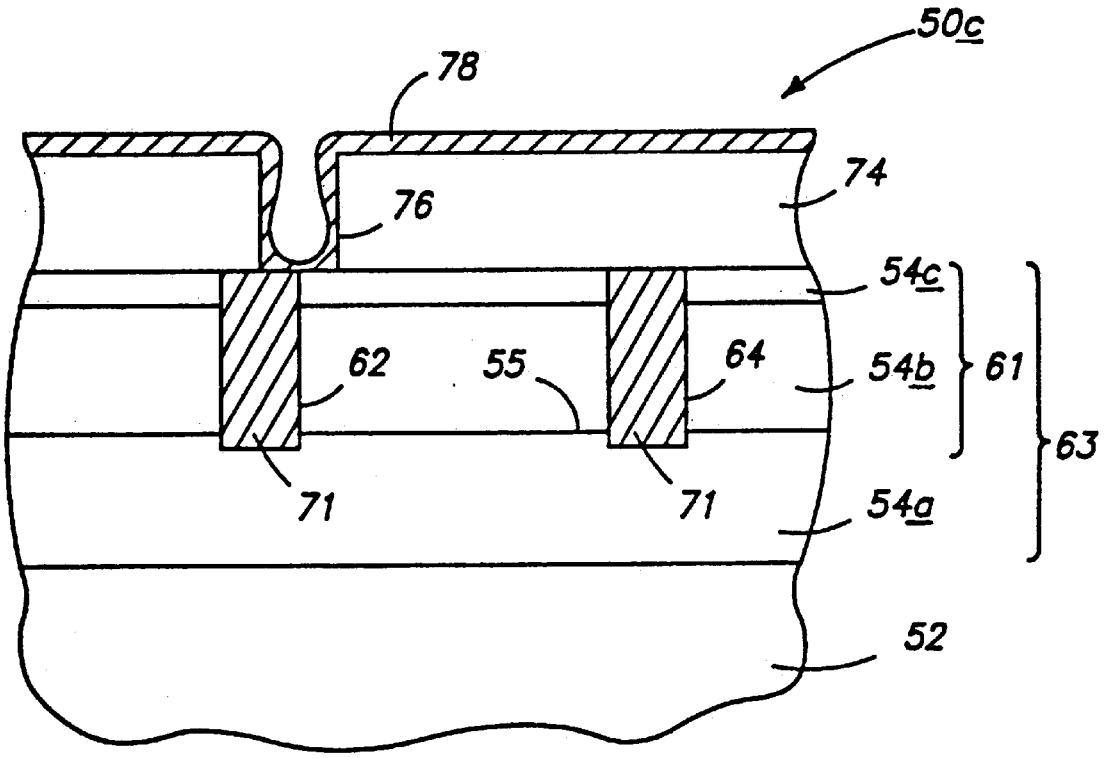

Referring to FIG. 13, first metal layer 71 is planarized back to uppermost region 54a of foundation insulating layer 61 to form conductive metal runners within grooved pathway 62, 64.

The process would then proceed largely as described above. For example and referring to FIG. 14, an overlying layer 74 of insulating material would be provided atop a foundation layer 61 and the previously formed conductive metal runners. The insulating material of overlying layer 74 would again be different in composition from the insulation material of uppermost region [54a] *54c* of foundation layer 61, essentially as described above. Overlying layer 74 would be selectively etched to provide a second contact 76 within grooved pathway 62 with uppermost region [74] *54c* of insulating material of foundation layer 61 functioning as a contact etch stop of overlying layer 74, and thereby substantially preventing etching of insulating material of foundation layer 61 adjacent the conductive metal runners formed within groove pathway 62. A subsequent metal layer 78 would be deposited and patterned. Analogously as described above, region 61 in this described embodiment is shown to not be homogenous. Alternately, layer 61 could be formed to be homogenous. Materials for the various layers 74 and 54a, or a homogenous layer 61, would be described as above for the same stated purposes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor metallization processing method for multi-level electrical interconnection, the method comprising the following steps:

providing a first layer of insulating material atop a semiconductor wafer *having an upper surface* over an area to which electrical connection is to be made*, the first layer having a first surface in contact with at least a portion of the upper surface of the semiconductor wafer*;

providing a second layer of insulating material atop the first layer of insulating material, the insulating material of the second layer being different from the insulating material of the first layer, the second layer of insulating material having an upper surface;

etching a groove pathway into the second layer of insulating material for definition of a conductive metal runner*, the groove pathway having a width*;

providing a first contact through the second and first layers of insulating material to the area to which electrical connection is to be made*, the first contact falling within the groove pathway, the first contact having a width about the same width as the width of the groove pathway and extending from at least a portion of the upper surface of the semiconductor wafer to about the upper surface of the second layer of insulating material*;

the groove pathway being etched and the first contact being provided in a combined manner which has the groove pathway and the first contact communicating with one another;

providing metal within the first contact and within the groove pathway, the metal provided within the first contact and groove pathway in combination defining a first metal layer, the first metal layer having an overall thickness which is sufficient to fill the first contact and groove pathway;

planarizing the first metal layer back to the upper surface of the second insulating layer to form a conductive metal runner within the groove pathway;

providing a third layer of insulating material atop the second layer of insulating material and formed conductive metal runner, the insulating material of the third layer being different in composition from the insulating material of the second layer with the insulating material of the third layer being selectively etchable relative to the insulating material of the second layer and selectively etchable relative to the first metal layer;

etching through the third layer of insulating material selectively relative to the second layer of insulating material to provide a second contact to the conductive metal runner, the second contact overlapping the conductive metal runner and second layer of insulating material, the conductive metal runner being void of surround where the second contact overlaps the conductive metal runner, the second layer of insulating material functioning as a contact etch stop during etching of the third layer and thereby substantially preventing etching of insulating material of the second layer adjacent the conductive metal runner; and depositing and patterning a second metal layer atop the etched third layer of insulating material, the second metal layer lining within the second contact and contacting the conductive metal runner therewithin.

2. The semiconductor metallization processing method of claim 1 wherein the second layer of insulating material comprises $Si_3N_4$.

3. The semiconductor metallization processing method of claim 1 wherein the first and third layers of insulating material each comprise an oxide.

4. The semiconductor metallization processing method of claim 1 wherein the second layer of insulating material comprises $Si_3N_4$, and the third layer of insulating material comprises an oxide.

5. The semiconductor metallization processing method of claim 1 wherein the second layer of insulating material comprises $Si_3N_4$, and the first and third layers of insulating material each comprise an oxide.

6. The semiconductor metallization processing method of claim 1 wherein the planarizing step comprises a chemical mechanical polishing technique.

7. The semiconductor metallization processing method of claim 1 wherein the groove pathway is etched completely through the second layer of insulating material and only partially into the first layer of insulating material.

8. The semiconductor metallization processing method of claim 1 further comprising depositing a reference layer of $Si_3N_4$ prior to depositing the [base] *first* layer of insulating material, the step of etching the groove pathway comprising etching through the first layer of insulating material to the reference layer.

9. A semiconductor metallization processing method for multi-level electrical interconnection, the method comprising the following steps:

providing a base layer of insulating material atop a semiconductor wafer over an area to which electrical connection is to be made, the base layer of insulating material having an uppermost region;

etching a groove pathway into the base layer of insulating material for definition of a conductive metal runner*, the groove pathway having a width*;

providing a first contact through the base layer to the area to which electrical connection is to be made*, the first contact having a width about the same as the width of the groove pathway and falling within the width of the groove pathway*;

the groove pathway being etched and the first contact being provided in a combined manner which has the groove pathway and the first contact communicating with one another;

providing metal within the first contact and within the groove pathway, the metal provided within the first contact and groove pathway in combination defining a first metal layer, the first metal layer having an overall thickness which is sufficient to fill the first contact and groove pathway;

planarizing the first metal layer back to the uppermost region of the base insulating layer to form a conductive metal runner within the groove pathway;

providing an overlying layer of insulating material atop the base layer of insulating material and formed conductive metal runner, the insulating material of the overlying layer being different in composition from the insulating material of the uppermost region of the base layer with the insulating material of the overlying layer being selectively etchable relative to the insulating material of the uppermost region and selectively etchable relative to the first metal layer;

etching through the overlying layer of insulating material selectively relative to the uppermost region of insulating material of the base layer to provide a second contact to the conductive metal runner, the second contact overlapping the conductive metal runner and uppermost region of insulating material of the base layer, the conductive metal runner being void of surround where the second contact overlaps the conductive metal runner, the uppermost region of the insulating material of the base layer functioning as a contact etch stop during etching of the overlying layer and thereby substantially preventing etching of insulating material of the base layer adjacent the conductive metal runner; and depositing and patterning a second metal layer atop the etched overlying layer of insulating material, the second metal layer lining within the second contact and contacting the conductive metal runner therewithin.

10. The semiconductor metallization processing method of claim 9 wherein the uppermost region comprises $Si_3N_4$.

11. The semiconductor metallization processing method of claim 9 wherein the base layer of insulating material is homogeneous.

12. The semiconductor metallization processing method of claim 9 wherein the planarizing step comprises a chemical mechanical polishing technique.

13. The semiconductor metallization processing method of claim 9 further comprising depositing a reference layer of $Si_3N_4$ prior to depositing the base layer of insulating material, the step of etching the groove pathway comprising etching through the first layer of insulating material to the reference layer.

14. A semiconductor metallization processing method for multi-level electrical interconnection, the method comprising the following steps:

providing a base layer of insulating material atop a semiconductor wafer over an area to which electrical connection is to be made, the base layer of insulating material having an uppermost region;

etching a groove pathway into the base layer of insulating material for definition of a conductive metal runner*, the groove pathway having a width*;

providing a first contact through the base layer to the area to which electrical connection is to be made*, the first contact having a width about the same as the width of the groove pathway and falling within the groove pathway*;

the groove pathway being etched and the first contact being provided in a combined manner which has the groove pathway and the first contact communicating with one another;

providing metal within the first contact and within the groove pathway, the metal provided within the first contact and groove pathway in combination defining a first metal layer, the first metal layer having an overall thickness which is sufficient to fill the first contact and groove pathway;

planarizing the first metal layer back to the uppermost region of the base insulating layer to form a conductive metal runner within the groove pathway;

selectively etching first metal of the conductive metal runner within the groove pathway relative to the base insulating layer uppermost region to recess the conductive metal runner within the base layer of insulating material;

providing an overlying layer of insulating material atop the base layer of insulating material and formed conductive metal runner, the insulating material of the overlying layer being different in composition from the insulating material of the uppermost region of the base layer with the insulating material of the overlying layer being selectively etchable relative to the insulating material of the uppermost region and selectively etchable relative to the first metal layer;

etching through the overlying layer of insulating material selectively relative to the uppermost region of insulating material of the base layer to provide a second contact to the conductive metal runner, the second contact overlapping the conductive metal runner and uppermost region of insulating material of the base layer, the conductive metal runner being void of surround where the second contact overlaps the conductive metal runner, the uppermost region of the insulating material of the base layer functioning as a contact etch stop during etching of the overlying layer and thereby substantially preventing etching of insulating material of the base layer adjacent the conductive metal runner; and depositing and patterning a second metal layer atop the etched overlying layer of insulating material, the second metal layer lining within the second contact and contacting the conductive metal runner therewithin.

15. The semiconductor metallization processing method of claim 14 wherein the base layer of insulating material is homogeneous.

16. The semiconductor metallization processing method of claim 14 wherein the base layer of insulating material is not homogeneous, the uppermost region of the base layer being formed of a different material from remaining portions of the base layer.

17. The semiconductor metallization processing method of claim 14 wherein the uppermost region comprises $Si_3N_4$.

18. The semiconductor metallization processing method of claim 14 wherein the planarizing step comprises a chemical mechanical polishing technique.

19. A semiconductor metallization processing method for multi-level electrical interconnection, the method comprising the following steps:

providing a base layer of insulating material atop a semiconductor wafer over an area to which electrical connection is to be made, the base layer of insulating material having an uppermost region;

etching a groove pathway into the base layer of insulating material for definition of a conductive metal runner, *the groove pathway having a width*;

providing a first contact through the base layer to the area to which electrical connection is to be made, *the first contact having a width about the same as the width of the groove pathway and falling within the groove pathway*;

the groove pathway being etched and the first contact being provided in a combined manner which has the groove pathway and the first contact communicating with one another;

providing metal within the first contact and within the groove pathway, the metal provided within the first contact and groove pathway in combination defining a first metal layer, the first metal layer having an overall thickness which is sufficient to fill the first contact and groove pathway;

planarizing the first metal layer back to the uppermost region of the base insulating layer to form a conductive metal runner within the groove pathway;

providing an overlying layer of insulating material atop the base layer of insulating material and formed conductive metal runner, the insulating material of the overlying layer being different in composition from the insulating material of the uppermost region of the base layer with the insulating material of the overlying layer being selectively etchable relative to the insulating material of the uppermost region and selectively etchable relative to the first metal layer;

etching through the overlying layer of insulating material selectively relative to the uppermost region of insulating material of the base layer to provide a second contact to the conductive metal runner, the second contact overlapping the conductive metal runner and uppermost region of insulating material of the base layer, the conductive metal runner being void of surround where the second contact overlaps the conductive metal runner, the uppermost region of the insulating material of the base layer functioning as a contact etch stop during etching of the overlying layer and thereby substantially preventing etching of insulating material of the base layer adjacent the conductive metal runner; and sputter depositing a predominately aluminum layer atop the etched layer of insulating material, the predominately aluminum layer lining within the second contact and contacting the conductive metal runner therewithin.

20. The semiconductor metallization processing method of claim 19 wherein the base layer of insulating material is homogeneous.

21. The semiconductor metallization processing method of claim 19 wherein the base layer of insulating material is not homogeneous, the uppermost region comprising a different material from remaining portions of the base layer.

22. The semiconductor metallization processing method of claim 19 wherein the uppermost region comprises $Si_3N_4$.

23. The semiconductor metallization processing method of claim 19 wherein the planarizing step comprises a chemical mechanical polishing technique.

24. A semiconductor metallization processing method for multi-level electrical interconnection, the method comprising the following steps:

providing a primary layer of insulating material atop a semiconductor wafer over an area to which electrical connection is to be made, the primary layer having an upper surface;

providing a first contact through the primary layer of insulating material to the area to which electrical connection is to be made, *the first contact having a width*;

depositing a plugging metal layer atop the wafer over the primary layer and to within the first contact to a thickness sufficient to fill the first contact;

planarizing the plugging metal layer back to the upper surface of the primary insulating layer to form a conductive metal plug within the first contact;

providing a foundation layer of insulating material atop the primary layer of insulating material and conductive metal plug, the foundation layer of insulating material having an uppermost region;

etching a groove pathway into the foundation layer of insulating material for definition of a conductive metal runner, the groove pathway outwardly exposing the conductive metal plug, *the groove pathway having a width about the same as the width of the conductive metal plug, the conductive metal plug falling within the groove pathway*;

providing groove filling metal atop the wafer and within the groove pathway to contact the conductive metal plug, the groove filling metal and the conductive metal plug in combination defining a first metal layer;

planarizing the first metal layer back to the uppermost region of the foundation insulating layer to form a conductive metal runner within the groove pathway;

providing an overlying layer of insulating material atop the foundation layer of insulating material and formed conductive metal runner, the insulating material of the overlying layer being different in composition from the insulating material of the uppermost region of the foundation layer with the insulating material of the overlying layer being selectively etchable relative to the insulating material of the uppermost region and selectively etchable relative to the first metal layer;

etching through the overlying layer of insulating material selectively relative to the uppermost region of insulating material of the foundation layer to provide a second contact to the conductive metal runner, the second contact overlapping the conductive metal runner and second layer of insulating material, the conductive metal runner being void of surround where the second contact overlaps the conductive metal runner, the uppermost region of the insulating material of the foundation layer functioning as a contact etch stop during etching of the overlying layer and thereby substantially preventing etching of insulating material of the foundation layer adjacent the conductive metal runner; and depositing and patterning a second metal layer atop the etched overlying layer of insulating material, the second metal layer lining within the second contact and contacting the conductive metal runner therewithin.

25. The semiconductor metallization processing method of claim 24 wherein the plugging metal is predominately aluminum.

26. The semiconductor metallization processing method of claim 24 wherein the plugging metal comprises tungsten, and the groove filling metal is predominately tungsten.

*27. A semiconductor metallization processing method for multi-level electrical interconnection, the method comprising the following steps:*

*providing a first layer of insulating material atop a semiconductor wafer;*

*providing a second layer of insulating material atop the first layer of insulating material, the insulating material of the second layer being different from the insulating material of the first layer, the second layer of insulating material having an upper surface;*

*etching a groove pathway into at least the second layer of insulating material for definition of a conductive metal runner, the groove pathway having a width;*

*providing metal within the groove pathway, the metal provided within the groove pathway defining a first metal layer, the metal deposited by sputter deposition of aluminum;*

*removing the first metal layer back to the upper surface of the second insulating layer to form a conductive metal runner within the groove pathway;*

*providing a third layer of insulating material atop the second layer of insulating material and formed conductive metal runner, the insulating material of the third layer being different in composition from the insulating material of the second layer with the insulating material of the third layer being selectively etchable relative to the insulating material of the second layer and selectively etchable relative to the first metal layer;*

*etching through the third layer of insulating material selectively relative to the second layer of insulating material to provide a contact having a width about the same as the width of the groove pathway to the conductive metal runner, the conductive metal runner being devoid of surround where the contact overlaps the conductive metal runner, the second layer of insulating material functioning as a contact etch stop during etching of the third layer; and*

*depositing and patterning a second metal layer atop the etched third layer of insulating material, the second metal layer contacting the conductive metal runner, the second metal layer deposited by sputter deposition.*

*28. The semiconductor metallization processing method of claim 27 wherein the second layer of insulating material comprises* $Si_3N_4$.

*29. The semiconductor metallization processing method of claim 27 wherein the first and third layers of insulating material each comprise an oxide.*

*30. The semiconductor metallization processing method of claim 27 wherein the second layer of insulating material comprises* $Si_3N_4$, *and the third layer of insulating material comprises an oxide.*

*31. The semiconductor metallization processing method of claim 27 wherein the second layer of insulating material comprises* $Si_3N_4$, *and the first and third layers of insulating material each comprise an oxide.*

*32. The semiconductor metallization processing method of claim 27 wherein the removing step comprises a chemical mechanical polishing technique.*

*33. The semiconductor metallization processing method of claim 27 wherein the groove pathway is etched completely through the second layer of insulating material and partially into the first layer of insulating material.*

*34. The semiconductor metallization processing method of claim 27, wherein said second insulating layer comprises oxide, and wherein said third insulating layer comprises polyimide.*

*35. A semiconductor metallization processing method for multi-level electrical interconnection, the method comprising:*

*providing a base layer of insulating material atop a semiconductor wafer, the base layer of insulating material having an uppermost region;*

*etching a groove pathway into the base layer of insulating material for definition of a conductive metal runner, the groove pathway having a width;*

*providing metal within the groove pathway, the metal provided within the groove pathway forming a first metal layer, the first metal layer having an overall thickness which is sufficient to fill the groove pathway, the metal deposited by sputter deposition of aluminum;*

*planarizing the first metal layer back to the uppermost region of the base insulating layer to form a conductive metal runner within the groove pathway;*

*providing an overlying layer of insulating material atop the base layer of insulating material and formed conductive metal runner, the insulating material of the overlying layer being different in composition from the insulating material of the uppermost region of the base layer with the insulating material of the overlying layer being selectively etchable relative to the insulating material of the uppermost region and selectively etchable relative to the first metal layer;*

*etching through the overlying layer of insulating material selectively relative to the uppermost region of insulating material of the base layer to provide a contact to the conductive metal runner, the contact falling within the confines of the conductive metal runner and uppermost region of insulating material of the base layer, the uppermost region of the insulating material of the base layer functioning as a contact etch stop during etching of the overlying layer and thereby substantially preventing etching of insulating material of the base layer adjacent the conductive metal runner, the contact having a width about the same as the width of the groove pathway of the conductive metal runner; and*

*sputter depositing an aluminum layer atop the etched layer of insulating material, the aluminum layer lining within the contact and contacting the conductive metal runner.*

*36. The semiconductor metallization processing method of claim 35 wherein the base layer of insulating material is homogeneous.*

*37. The semiconductor metallization processing method of claim 35 wherein the base layer of insulating material is*

*not homogeneous, the uppermost region comprising a different material from remaining portions of the base layer.*

*38. The semiconductor metallization processing method of claim 35 wherein the uppermost region comprises* $Si_3N_4$.

*39. The semiconductor metallization processing method of claim 35, wherein the planarizing step comprises a chemical mechanical polishing technique.*

*40. The semiconductor metallization processing method of claim 35, wherein said insulating material of said uppermost region of said base layer comprises oxide and wherein said overlying layer of insulating material comprises polyimide.*

*41. A semiconductor metallization processing method for multi-level electrical interconnection, the method comprising:*

*providing a layer of insulating material on a semiconductor wafer, the layer of insulating material having an uppermost region;*

*etching a groove pathway into the layer of insulating material for definition of a conductive metal runner, the groove pathway having a width;*

*providing groove filling metal atop the wafer and within the groove pathway, the groove filling metal defining a first metal layer, the metal comprising aluminum deposited by sputter deposition;*

*removing the first metal layer back to the uppermost region of the foundation insulating layer to form a conductive metal runner within the groove pathway;*

*providing an overlying layer of insulating material atop the layer of insulating material and formed conductive metal runner, the insulating material of the overlying layer being different in composition from the insulating material of the uppermost region of the foundation layer with the insulating material of the overlying layer being selectively etchable relative to the insulating material of the uppermost region and selectively etchable relative to the first metal layer;*

*etching through the overlying layer of insulating material selectively relative to the uppermost region of insulating material of the foundation layer to provide a contact having a width about the same as the width of the groove pathway of the conductive metal runner, the contact overlapping the conductive metal runner and second layer of insulating material, the uppermost region of the insulating material of the foundation layer functioning as a contact etch stop during etching of the overlying layer and thereby substantially preventing etching of insulating material of the foundation layer adjacent the conductive metal runner; and*

*depositing and patterning a second metal layer atop the etched overlying layer of insulating material, the second metal layer lining within the contact and contacting the conductive metal runner, the second metal layer comprising a metal deposited by sputter deposition.*

*42. The semiconductor metallization processing method of claim 41 wherein the second metal layer comprises aluminum.*

*43. The semiconductor metallization processing method of claim 41, wherein said insulating material of said uppermost region of said base layer comprises oxide and wherein said overlying layer of insulating material comprises polyimide.*

* * * * *